United States Patent [19]

Gould

[11] 4,398,344
[45] Aug. 16, 1983

[54] METHOD OF MANUFACTURE OF A SCHOTTKY USING PLATINUM ENCAPSULATED BETWEEN LAYERS OF PALLADIUM SINTERED INTO SILICON SURFACE

[75] Inventor: Herbert J. Gould, Sherman Oaks, Calif.

[73] Assignee: International Rectifier Corporation, Los Angeles, Calif.

[21] Appl. No.: 355,718

[22] Filed: Mar. 8, 1982

[51] Int. Cl.³ .......................................... H01L 29/48
[52] U.S. Cl. ...................................... 29/590; 427/84; 357/15; 156/638
[58] Field of Search .................. 29/589, 590, 591; 427/84; 148/188; 357/15, 67; 156/638, 662

[56] References Cited

U.S. PATENT DOCUMENTS 4,206,540  6/1980  Gould .................................. 29/590

Primary Examiner—L. Dewayne Rutledge
Assistant Examiner—Alan E. Schiavelli
Attorney, Agent, or Firm—Ostrolenk, Faber, Gerb & Soffen

[57] ABSTRACT

A schottky diode and process of manufacture therefor is disclosed wherein a schottky junction is formed between a tungsten schottky barrier metal and a silicon surface which has been treated to produce a single crystal surface by sintering thereto platinum which is encapsulated on its upper and lower surface with palladium layers. After the sintering operation, all traces of silicide are removed by etching and a tungsten or molybdenum schottky barrier layer is applied to the silicide-treated layer. The resultant schottky junction is capable of good operation at extremely high temperatures, for example 200° C. and can be produced with high yield.

13 Claims, 11 Drawing Figures

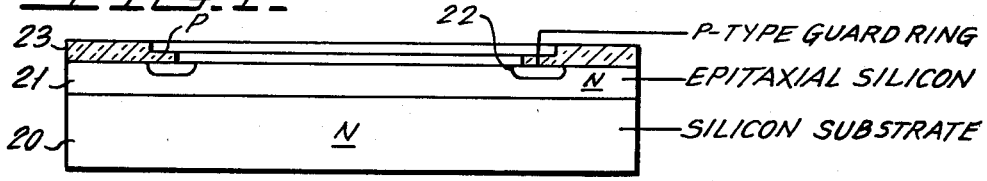
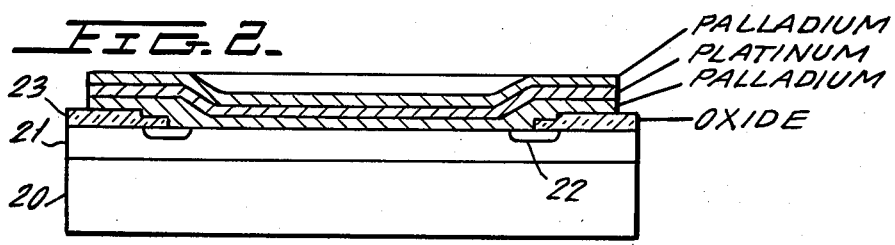
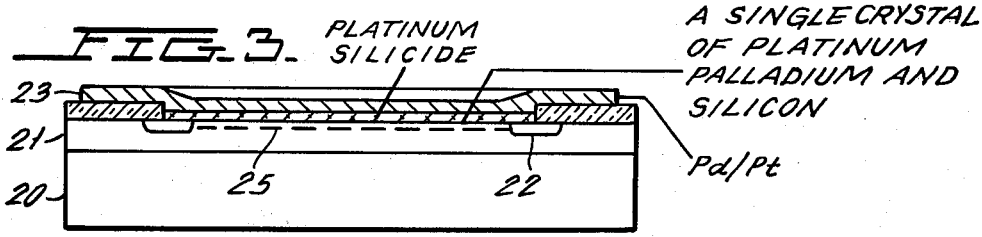
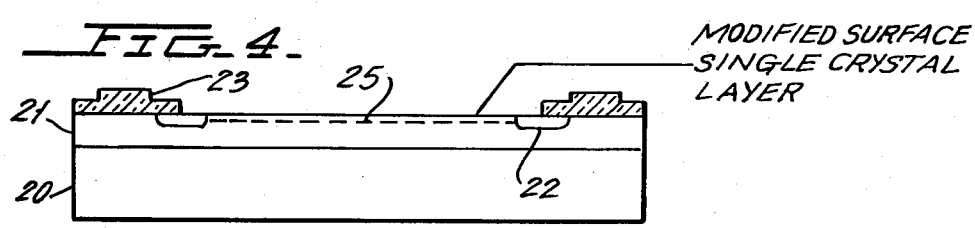
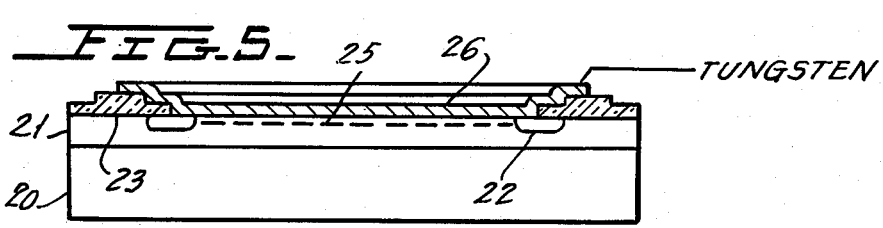
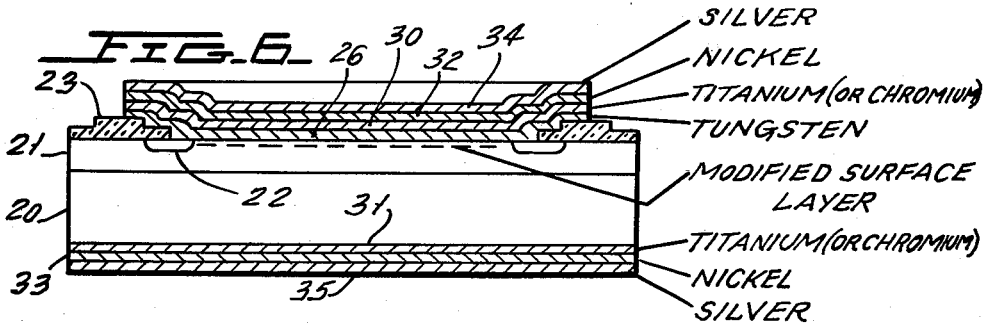

METHOD OF MANUFACTURE OF A SCHOTTKY USING PLATINUM ENCAPSULATED BETWEEN LAYERS OF PALLADIUM SINTERED INTO SILICON SURFACE

BACKGROUND OF THE INVENTION

This invention relates to Schottky diodes and more specifically relates to a novel structure and process for manufacture of high temperature Schottkys which has a very high yield.

This invention is an improvement of the product and process described in U.S. Pat. No. 4,206,540 in the name of Herbert J. Gould, entitled "Schottky Diode and Method of Manufacture Using Palladium and Platinum Intermetallic Alloys and Titanium Barrier" and assigned to the assignee of the present application. The above patent describes a process for manufacturing a Schottky diode wherein either platinum or palladium is sintered into the surface of a silicon crystal to form a platinum or palladium silicide respectively. Thereafter the silicide is removed by etching with aqua regia. A single crystal layer is believed to remain on the silicon surface. The exact nature of the single crystal film which remains after the etching operation is not known.

It is believed however that the silicon surface is modified by the diffusion into it, to a depth of the order of tens of Angstrons, of palladium or platinum. For all practical purposes, the surface is a silicon surface in terms of its optical properties and in terms of its behavior with acids. However, the presence of the layer produces the extremely improved Schottky characteristics when contacted by a Schottky metal. Thus, the platinum or palladium silicide can be thought of as a doping source for the silicon substrate. After removal of the silicide, a conventional high work function material such as molybdenum, tungsten or chromium is applied over the single crystal film. The resulting Schottky barrier has excellent high temperature characteristics radically improved when compared to the same barrier metal, but on an untreated silicon surface.

When using platinum instead of palladium as the material for producing the silicide-treated surface, or single crystal film, the ultimately produced Schottky barrier has better high temperature characteristics. However, the yield during the manufacturing process is very low so that the process was not commercially feasible. In order to improve yield and as described in the patent, the platinum was encapsulated with a molybdenum layer over the top of the platinum. During the sintering operation the molybdenum acts as an oxygen barrier thus promoting the formation of silicide and yields using this process were improved, but are still low.

BRIEF DESCRIPTION OF THE INVENTION

The present invention provides a novel process and an improved product whereby platinum can be used to form the probable single crystal layer atop the silicon but which produces high manufacturing yields. The resulting device has the exceptionally high temperature characteristics which are obtained when using platinum as the sintering metal. In accordance with the invention, the platinum is encapsulated on its top and bottom surfaces with palladium. In one embodiment of the invention, the upper and lower palladium layers consist of about 80% by weight of the total palladium platinum sandwich. However, other ratios can be used. The lower palladium layer is believed to act as a fluxing agent during the sintering process and prevents the formation of oxides on the silicon during the sintering process. The upper layer of palladium is believed to act as an oxygen barrier during the sintering process.

After the single crystal layer has been formed and as in the known process, it is contacted by a high work function metal. The best reults have been obtained when using tungsten as the high work function metal for contacting the single crystal layer. However, molybdenum can also be used.

After forming the Schottky barrier, a metallizing system such as that described in above-noted U.S. Pat. No. 4,206,540 is applied to the upper and lower surfaces of the device. This metallizing system will include suitable contact metals such as silver and nickel on the upper and lower surfaces of the device which can receive soldered connections. As also described in above noted U.S. Pat. No. 4,206,540, a diffusion barrier metal disclosed as titanium in the patent is interposed between the Schottky barrier metal surface of the device and the contact metals. This diffusion barrier metal is used to prevent diffusion of impurities into the Schottky barrier layer during solder down of the wafer into its package or housing. It has been found that chromium is an excellent barrier metal and, in accordance with the present invention, it has been found that chromium can serve as the barrier metal in place of titanium.

As a consequence of the palladium encapsulation, manufacturing yields are extremely high and the resulting device has essentially the same characteristics at high temperature as the device formed with platinum sintered directly into silicon and subsequently processed as described above, which process however had very low manufacturing yields. The relative percentage of platinum and palladium in the sandwich can be altered as desired. Increasing the percentage of platinum will decrease the saturation current of the device at high temperatures. Thus, depending on device application, the ratio of platinum to palladium can be adjusted to obtain any desired trade-off between turn-on in the forward direction and hot reverse leakage current.

As a further feature of the invention, the novel palladium encapsulated platinum can be used more broadly, for example, for ensuring uniform diffusion of platinum into fast recovery PN junction rectifiers. It is common to diffuse gold into a junction type rectifier in order to increase the recovery speed of the device. It is known that platinum diffused fast recovery rectifiers will match the speed of gold diffused devices but, whereas gold doped devices will typically increase saturation current by a factor of 100 at all temperatures, platinum will increase saturation current by only a factor of about 3. Platinum however has not been used as the doping atom for fast recovery rectifiers because it is very difficult to diffuse the platinum uniformly into the device.

In accordance with a broad aspect of the present invention, a platinum layer encapsulated on top and bottom with palladium enables the uniform diffusion of platinum into the surface of a PN junction device. The lower palladium layer acts as a fluxing agent to prevent the formation of oxides at the interface of the palladium platinum sandwich and the silicon surface and ensures uniform diffusion of platinum atoms into the silicon surface, unimpeded by surface oxides which block the platinum atoms. The upper layer acts as a barrier to diffusion of oxygen into the sandwich and toward the silicon surface. Thus, the novel invention may be usefully employed in the production of high speed PN junction rectifier devices.

BRIEF DESCRIPTION OF THE DRAWINGS

FIG. 1 is a schematic cross-sectional view of a portion of a semiconductor wafer which can be used in carrying out the present invention and in which a guard ring has been diffused;

FIG. 2 shows the wafer of FIG. 1 after the formation of a masking oxide layer and after a layer consisting of a sandwich of palladium, platinum and palladium is deposited on the substrate surface;

FIG. 3 shows the wafer of FIG. 2 after the sintering of the palladium-platinum-palladium sandwich into the silicon surface;

FIG. 4 shows the wafer of FIG. 3 after the remaining palladium and platinum metals and their silicides have been etched away from the substrate leaving behind a platinum diffused silicon surface which may also include palladium in a single crystal film which includes silicon;

FIG. 5 shows the wafer of FIG. 4 after a tungsten layer has been deposited on the wafer surface;

FIG. 6 shows the wafer of FIG. 5 after contact metals are applied to the wafer and further shows a titanium or chromium layer disposed between the Schottky barrier and the upper contact metals;

DETAILED DESCRIPTION OF THE DRAWINGS

Figures 4A, 4B, 7:
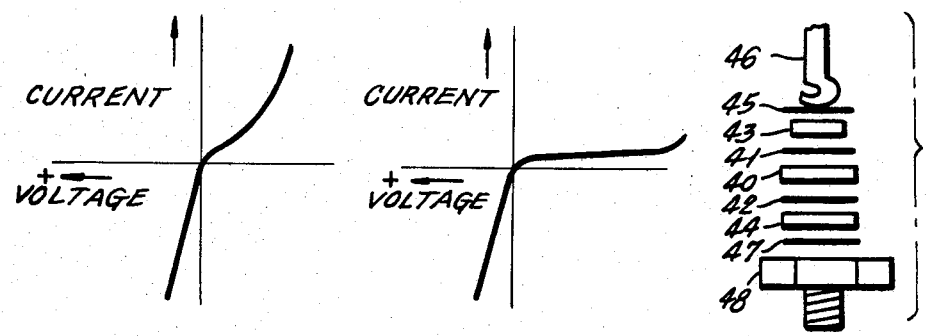
FIGS. 4a and 4b show the reverse voltage characteristics between a tungsten probe and the surface of the wafer of FIG. 4 for the case of incomplete and complete removal respectively of the silicide layer.
FIG. 7 is an exploded view of the assembly of a Schottky diode of the invention with the outer housing removed to reveal the interior parts.

Referring first to FIG. 1, there is shown therein a silicon substrate which may be a small part of a larger wafer on which a plurality of devices are simultaneously formed. The substrate 20 is hereinafter described as a monocrystalline silicon substrate, but it will be understood that other semiconductor materials can be used. Substrate 20 may be Czochralsky grown silicon wafers having a diameter of 3 inches and a thickness of 14 to 15 mils with N type conductivity using an arsenic dopant. The resistivity of the wafer may be from 0.001 to 0.004 ohm-cm. The wafer section shown in schematic cross-section in FIG. 1 is a rectangular chip section which is a square about 200 mils on edge. Note that the thickness of the wafer is greatly exaggerated for purposes of clarity.

An epitaxial layer 21 is grown atop layer 20 to a thickness of from 5.0 to 6.0 microns. Layer 21 has an N type conductivity and may be phosphorus doped to a resistivity of from 0.9 to 1.1 ohm cm.

FIG. 1 shows a guard ring 22 which is a rectangular P-type ring diffused in the surface 21 to serve as a zener clamp, and to prevent fringing effects. In order to form ring 22, an oxide mask 23 is formed on the surface of layer 21 and a ring-shaped opening is formed in the oxide layer. Boron, or some other P type impurity is then deposited into the open window and is diffused into layer 21 to its desired depth. Guard ring 22 may have a depth of about 0.5 micron and a width of about 4 mils. The central opening in ring 22 may be about 176 mils.

During diffusion of guard ring 22, an oxide layer grows over the open guard ring window. A window is opened in the oxide layer 23, as shown in FIG. 2, which extends to about the center of the width of guard ring 22, using conventional photolithographic and etching techniques.

After the window is opened in oxide layer 23, a sandwich of metal consisting of outer layers of palladium and an interior layer of platinum is formed on the surface of layer 21. Thus, as shown in FIG. 2, a first layer of palladium is deposited as by evaporation onto the surface of layer 21 at a substrate temperature of about 250° C. to a thickness of about 400 angstroms. Thereafter, a layer of platinum is evaporated onto the surface of the palladium again at a substrate temperature of about 250° C. to a thickness of about 200 angstroms. Thereafter, a third layer which is of palladium is evaporated onto the upper surface of the platinum and is evaporated at a substrate temperature of about 250° C. to a thickness of about 400 angstroms. Consequently, the layer of platinum is encapsulted or sandwiched between upper and lower palladium layers.

Note that other relative thicknesses could be used for the palladium and platinum as desired. By increasing the relative percentage of platinum, one can expect a reduction in the saturation current of the Schottky under reverse bias conditions at very high temperatures.

After the deposition of the palladium and platinum, the metals are sintered with the silicon substrate at a temperature of about 500° C. in a blanket of gas which includes about 15% hydrogen gas and 85% nitrogen gas. During the sintering operation, the lower layer of palladium will act as a fluxing agent for the platinum and will prevent the growth of oxides during the sintering process. The upper layer of palladium will act as a diffusion barrier to oxygen which would otherwise inhibit the growth of silicide in the platinum. When the the sintering operation is completed, a silicide of both platinum and palladium but principally of platinum will be present as shown in FIG. 3. Pure palladium and platinum, is disposed atop the silicide layer. The exact composition of the silicide is unknown, and the mechanism by which the silicon surface is modified is also unknown.

Thereafter, the silicides of palladium and platinum are intentionally fully removed in order to expose a lower layer 25, shown in FIGS. 3 an 4, which is a layer which was diffused into the upper surface of the silicon and is believed to an intermetallic alloy of palladium and platinum with the silicon. This layer is a single crystal layer but its exact nature is not known. The presence of the layer can be detected by contacting the upper surface of the device with a tungsten probe. The output of the tungsten probe will change from the rounded knee characteristic of FIG. 4a which indicates that a silicide is still present at the surface to that of FIG. 4b when the silicide is completely removed and the diffused silicon-metal layer 25 is exposed. It is believed that layer 25, which may be a single crystal layer, is a semiconductor which makes an excellent Schottky junction with high work function metals such as molybdenum, tungsten or chromium.

In order to expose layer 25, the following etching process may be used:

(a) The entire wafer is first immersed into aqua regia (about 3 parts HCl to 1 part HNO$_3$) at room temperature for about 30 seconds. This removes the palladium and platinum from the oxide layer.

(b) After rinsing, the wafer is immersed in a 5% HF solution for about 30 seconds. This is a novel step and is taken to remove SiO$_2$ from the palladium and platinum surface which is to be etched away.

(c) The wafer is rinsed and then immersed again in aqua regia at room temperature for about 30 minutes to strip palladium and platinum metal and their silicides out of the windows down to the surface of layer 25.

(d) The wafer is then rinsed and immersed in 5% HF for about 30 seconds to clean off any remaining SiO$_2$.

(e) The wafer is then rinsed and is spun dry.

(f) The above steps are all carried out under a non-critical hood. After stop (e) is completed, the wafer is transferred into an ultra-clean area and is washed with 18 megohm, deionized water.

(g) Thereafter, the wafer is cleaned, and then immersed in a solution of one part H$_2$SO$_4$ to one part H$_2$O$_2$. This mixture self-heats to about 115° C. for 15 minutes. This critical step removes all remaining palladium or platinum silicide.

(h) The wafer is then rinsed in 18 megohm water, and is then immersed in 5% HF for about 30 seconds.

(i) The wafer is again rinsed in 18 megohm water and is spun dry.

The wafer is now ready to receive a high work function metal which will contact layer 25. Thus, in FIG. 5, a tungsten layer 26 is evaporated onto the surface of the wafer while the wafer is at 250° C. Layer 26 may have a thickness of about 3000 angstroms. An excellent Schottky junction is formed between the tungsten layer 26 and layer 25. Note that other high work function materials such as molybdenum or tantalum or others could be used in place of the tungsten. It has been found that tungsten as the barrier metal will match the characteristics of a device containing platinum sintered silicon with a tungsten barrier metal, as will be described, but the yield of the manufacturing process using the palladium-platinum-palladium sandwich as the sintering metal is substantially higher than that using platinum encapsulated for example with molybdenum on its top surface as described in U.S. Pat. No. 4,206,540, and very much higher than the yield obtained using a simple platinum film on silicon.

It is now necessary to place contact metals on the opposite sides of the wafer of FIG. 6. A titanium layer 30 first is deposited on top of the tungsten layer 26. Titanium layer 30 has a thickness of about 2000 angstroms. Titanium layer 30 is believed to act as a barrier to prevent migration of atoms of the contact metals to the Schottky barrier between layers 25 and 26 due to the high temperatures experienced during soldering of the finished wafer in its housing. This effect has caused degradation of the device during its assembly in the past, but is prevented by the titanium layer. It has been found that chromium can also be used as the barrier metal in place of titanium.

Contact metals are then added to the device as shown in FIG. 6. Thus, a titanium of chromium layer 31 having a thickness of about 1000 angstroms is added to the bottom of the wafer and nickel layers 32 and 33 are applied top and bottom with thicknesses of about 1000 angstroms. Thereafter, thick silver layers 34 and 35 are applied with thicknesses of about 35,000 angstroms. Note that any other of the conventional contact metals such as gold could have been used.

The completed device is then cut from its main wafer for assembly into a housing as shown in FIG. 7. The housing may be one with a standard JEDEC outline DO-203AB (DO-5). The completed Schottky junction which is a square 200 mils on edge is shown as member 40. Lead-silver-indium solder wafers 41 and 42 are located on opposite sides of junction 40 and molybdenum plates 43 and 44 are placed on the opposite sides of wafers 41 and 42, respectively. Plates 43 and 44 have thicknesses of about 20 mils and diameters of 0.150 inch and 0.325 inch, respectively. A lead-silver-indium solder wafer 45 is disposed between wafer 43 and the C-bend lead 46. A gold-tin solder wafer 47 is disposed between molybdenum wafer 44 and a standard copper base 48. A cap, not shown, encloses the entire assembly. The assembly is soldered together by first heating to melt the solder wafers 41, 42, 45 and 57, and then cooling the assembly. The chromium or titanium layer 30 (FIG. 6) prevents migration of silver and nickel atoms to the Schottky junction during this solderdown operation.

The resulting device will then have an operating junction temperature range of −65° C. to 200° C.; and will have a reverse voltage up to 50 volts; and a maximum average forward current at 200° C. of 75 amperes for a rectangular waveform or 67.5 amperes for a sinusoidal waveform. The device will have a reverse leakage of 2.5 to 5. mA (typical) at 125° and 45 V increasing to perhaps 150 mA to 200 mA at 200° and 45 V.

Figure 9:
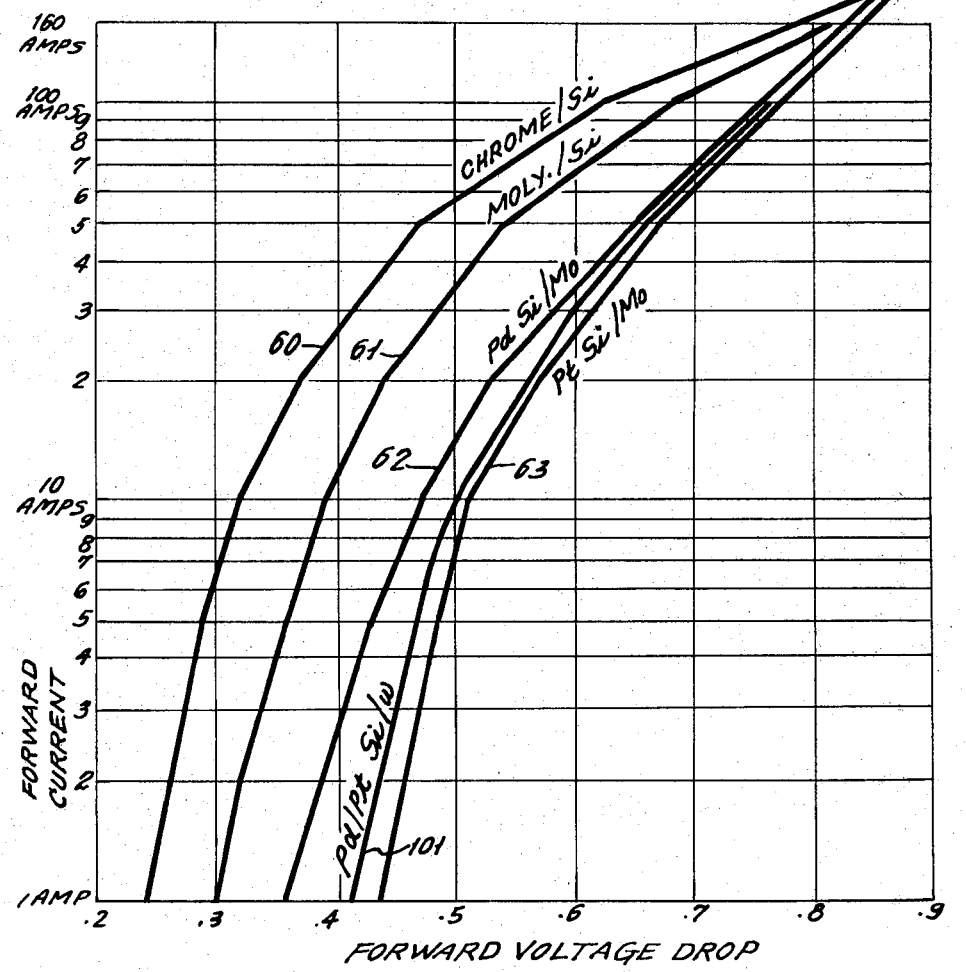
FIG. 9 shows the forward voltage drop at 25° C. for the Schottky devices of FIG. 8.
Figure 8:
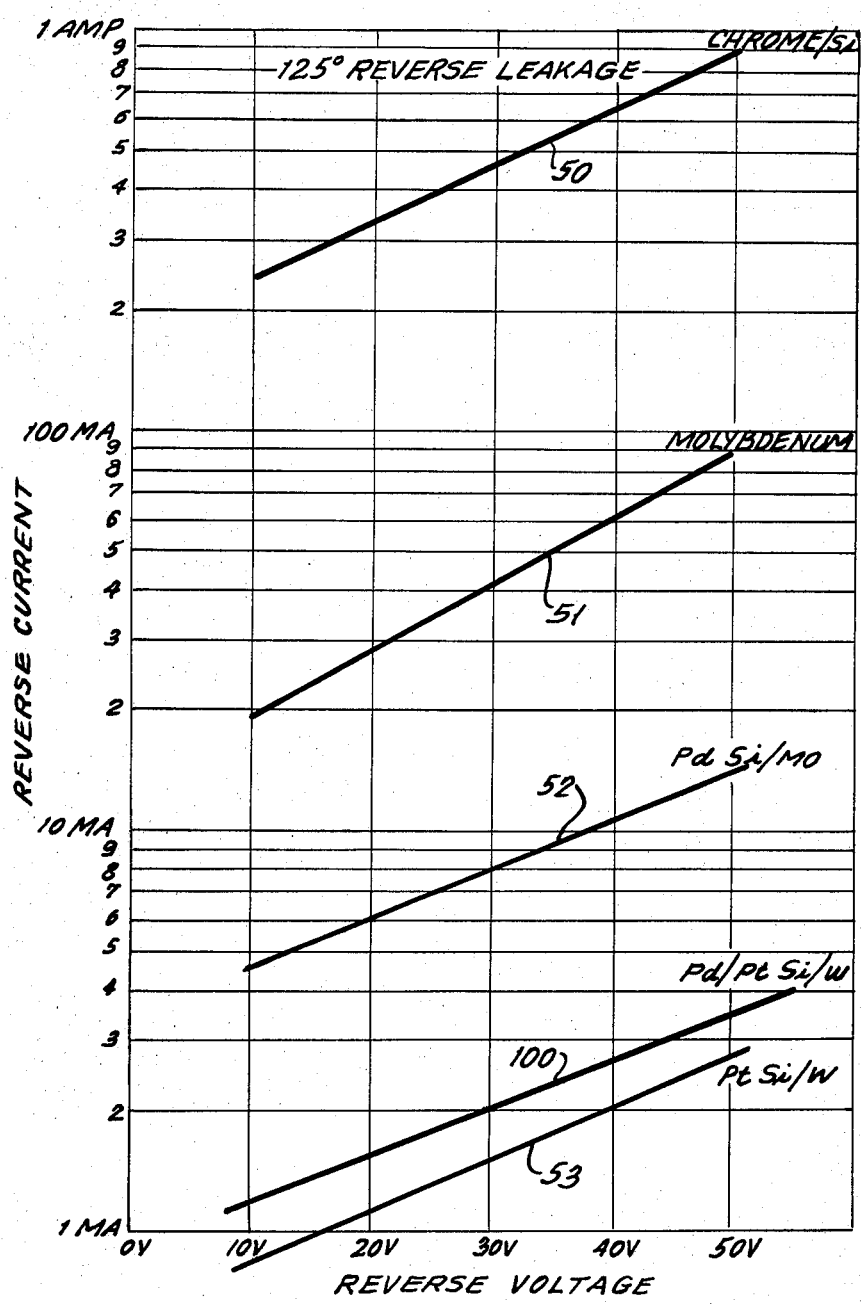
FIG. 8 shows the reverse current leakage at 125° C. for five different Schottky devices including the barrier of the present invention.

FIGS. 8 and 9 show some of the device characteristics and demonstrate the improvement in reverse leakage current at high temperature obtained with the invention. Thus, FIG. 8 shows leakage current on a logarithmic vertical axis plotted against reverse voltage on the horizontal axis for five different devices, all at a junction temperature of 125° C.

The uppermost curve 50 shows a conventional Schottky junction using a chromium contact on a silicon surface. It will be seen that the reverse current approaches one ampere at 50 volts.

The second curve 51 shows a conventional molybdenum contact on silicon which has a better reverse current characteristic than the equivalent chromium contact device. However, reverse current for the device is still about 90 milliamps at full reverse voltage.

The third curve 52 shows the characteristics of a device produced by the process of U.S. Pat. No. 4,206,540 in which palladium is the metal which is sintered into the silicon surface with the metal and its silicides thereafter removed. This device produces a substantial improvement in reverse current characteristics at full reverse voltage. Thus, at 50 volts the reverse current is only about 15 milliamperes which is an improvement of almost one order of magnitude over the conventional molybdenum-silicon junction characteristics shown in curve 51.

When platinum alone is used in place of palladium and tungsten in place of molybdenum as the barrier metal, as was described in U.S. Pat. No. 4,206,540, the characteristics of curve 53 are produced where, at full reverse voltage, the device reverse current is only about 2.9 milliamperes. It has been found, however, that devices of this structure cannot be reliably produced and that the manufacturing yield of the device is very low.

Curve 100 in FIG. 8 shows the characteristics of the device which is produced in accordance with the invention employing a palladium-platinum sandwich which is sintered into the silicon surface of the device and the silicides thereafter removed completely as has been described. The reverse current characteristics of this device at 125° C. are almost as good as those of the pure platinum structure shown in curve 53. However, the device can be produced with extremely high yields on a commercial scale. Moreover, the characteristics which are produced are significantly better than those of curves 50, 51 and 52 which represent the characteristics of present commercial devices.

The improvement in reverse current behavior obtained by the invention is not offset by loss of other characteristics. As shown in FIG. 9, there is only a slight increase in forward voltage drop at low current in devices made by the present invention as compared to prior art devices. Thus, curves 60 and 61 of FIG. 10 show the relatively low forward voltage drop, particularly at low forward current for the prior art chromium and molybdenum contacts to silicon. Devices made by the palladium and platinum processes respectively of U.S. Pat. No. 4,206,540 have the forward voltage characteristics of curves 62 and 63, respectively.

Curve 101 shows the characteristic of a device made in accordance with the present invention in which a sandwich of platinum and palladium is employed in the process with a tungsten barrier metal in contact with the single crystal layer which was produced by the novel process. Note that the forward voltage drop characteristic is better than that of curve 53 which is the characteristic of a device made with a pure platinum process. Note further that at high current all differences between the devices are negligible in FIG. 9.

To further compare devices produced by the present invention to prior art devices, the following table can be consulted:

TABLE 1

| | Metal | Semiconductor | Threshold $V_F$ | 125° $I_{SAT}$ |
|---|---|---|---|---|
| A. | Chrome | Silicon | .24V | 250mA |
| B. | Tungsten | Silicon | .255 | 120 |
| C. | Molybdenum | Silicon | .30 | 20.0 |
| D. | Molybdenum | Palladium/Silicon | .36 | 5.0 |
| E. | Tungsten | Palladium/Silicon | .37 | 5.0 |
| F. | Molybdenum | 80% Pd:20% Pt/Si | .38 | 5.0 High Yield |
| G. | Tungsten | 80% Pd:20% Pt/Si | .42 | 1.1 High Yield |
| H. | Tungsten | Platinum/Silicon | .44 | 1.0 |
| I. | (P/N Junction) | | .74 | 0.018 |

Table 1 identifies threshold voltage and hot reverse saturation current for a number of different barrier formation arrangements. Different barriers were constructed with the same active area of 20 square millimeters and measurements were made of threshold voltage and saturation current. The threshold forward voltage was measured at 25° C. with a current density of 50 milliamperes per square millimeter or 1 ampere for devices which were housed in a DO-5 housing. The saturation current $I_{SAT}$ was measured at 125° C. with a 300 microsecond pulse which avoided secondary heating effects and with a bias voltage of 10 volts reverse.

In Table 1, the column labeled "Metal" represents the barrier metal which was employed. The second column is the semiconductor substrate which was employed for receiving the barrier metal. Thus, the first three entries on the table are conventional barrier devices which employ a silicon semiconductor substrate receiving chromium, tungten and molybdenum barrier layers, respectively. Note that entries A and C correspond to the devices of curves 50 and 51 of FIG. 8.

Entries D and E in Table 1 represent devices which were made employing a single crystal palladium/silicon substrate which was formed by the process of U.S. Pat. No. 4,206,540 and with molybdenum and tungsten contacts respectively. Note that the device of entry D is the device having the characteristics of curve 52 of FIG. 8.

Entry H shows the device made by the process of U.S. Pat. No. 4,206,540 employing platinum as the sintering metal with a tungsten barrier electrode. This is the device having the characteristic of curve 53 of FIG. 8. Note that while its characteristic saturation current is extremely low, the device cannot be made with yields sufficiently high to be commercially viable.

Curves F and G show devices which are made by the process of the present invention wherein the substrate is the single crystal layer employing 80% palladium and 20% platinum to produce the single crystal layer 25 of FIGS. 3–5. Both devices have high manufacturing yields when using either molybdenum or tungsten as the contacts or barrier layer. Moreover, the device employing tungsten in entry G has a lower saturation current than the device employing molybdenum. Note further that the device of entry G corresponds to the device of curve 100 in FIG. 8 and curve 101 in FIG. 9.

The use of the platinum encapsulated with palladium produces an extremely effective Schottky device when using the process desscribed while maintaining extremely high yields. The novel sandwich of platinum encapsulated by palladium can also be used for platinum doping high recovery speed diodes and ensuring that platinum atoms will uniformly diffuse into the diode. This substantially decreases the recovery time of the diode approximately to that of gold doped diode but without increasing the saturation current of the device by the same amount as when using gold doping. Uniform doping by the platinum is obtained because of the operation of the palladium during the sintering or diffusion operation wherein the palladium will operate as a fluxing agent for the platinum.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. The process of manufacture of a Schottky device comprising the steps of depositing, on the surface of a silicon wafer, platinum which is encapsulated on its bottom and top surfaces with palladium, sintering the platinum and palladium into said surface of said silicon wafer, completely removing all traces of said platinum and said palladium and any silicides thereof from said surface such that the exposed surface exhibits a sharp knee reverse voltage characteristic when engaged by a tungsten probe, and depositing a high work function metal on said exposed surface.

2. The process of claim 1 wherein said high work function metal is tungsten.

3. The process of claim 1 wherein said platinum and palladium are present in proportions of 20% and 80% respectively by weight.

4. The process of claim 1, 2 or 3, which includes the further steps of depositing a diffusion barrier metal selected from the group comprised of chromium and titanium atop said high work function metal and depositing a contact metal atop said diffusion barrier metal and soldering said device into a housing.

5. The process of claim 1, 2 or 3, wherein said platinum and palladium and the silicides thereof are removed by etching in aqua regia for an extended period of time.

6. The process of claim 4, wherein said platinum and palladium and the silicides thereof are removed by etching in aqua regia for an extended period of time.

7. The process of manufacture of a Schottky device comprising the steps of depositing a first layer of palladium on the surface of a silicon wafer, depositing a layer of platinum atop said first layer of palladium, depositing a second layer of palladium atop said layer of platinum, thereby to encapsulate said platinum between said first and second layers of palladium, sintering said platinum into said surface of said silicone wafer, completely removing all traces of platinum and palladium metals and any silicides thereof from the surface of said silicon wafer, and depositing a high work function metal on said surface after all silicides have been removed therefrom.

8. The process of claim 7, wherein said platinum and palladium and the silicides thereof are removed by etching in aqua regia for an extended period of time.

9. The process of claim 7 or 8, wherein said high work function metal is tungsten.

10. The process of claim 7 or 8, wherein said platinum constitutes 20% by weight of the total weight of platinum and palladium.

11. The process of claim 9, wherein said platinum constitutes 20% by weight of the total weight of platinum and palladium.

12. The process of manufacture of a semiconductor device comprising the steps of depositing a first layer of palladium atop a silicon wafer, depositing a layer of platinum atop said first palladium layer, depositing a second layer of palladium atop said platinum; and thereafter heating said silicon wafer and said platinum and palladium layers in order to diffuse platinum into said silicon wafer with said palladium acting as a fluxing agent whereby platinum is uniformly diffused into said silicon.

13. The process of claim 12, wherein said silicon wafer has at least one PN junction therein.

* * * * *